United States Patent
Hu et al.

(10) Patent No.: US 11,121,207 B2
(45) Date of Patent: Sep. 14, 2021

(54) INTEGRATED TRENCH CAPACITOR WITH TOP PLATE HAVING REDUCED VOIDS

(71) Applicant: Texas Instruments Incorporated, Dallas, TX (US)

(72) Inventors: Binghua Hu, Plano, TX (US); Abbas Ali, Plano, TX (US); Sopa Chevacharoenkul, Richardson, TX (US); Jarvis Benjamin Jacobs, Murphy, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 486 days.

(21) Appl. No.: 15/348,459

(22) Filed: Nov. 10, 2016

(65) Prior Publication Data
US 2018/0130869 A1 May 10, 2018

(51) Int. Cl.
H01L 49/02 (2006.01)
H01L 21/762 (2006.01)
H01L 21/265 (2006.01)
H01L 21/308 (2006.01)

(52) U.S. Cl.
CPC ........ *H01L 28/40* (2013.01); *H01L 21/26513* (2013.01); *H01L 21/3081* (2013.01); *H01L 21/76224* (2013.01)

(58) Field of Classification Search
CPC ... H01L 28/40; H01L 23/5223; H01L 29/945; H01L 27/10829
See application file for complete search history.

(56) References Cited

U.S. PATENT DOCUMENTS

| | | | |
|---|---|---|---|
| 5,677,219 A * | 10/1997 | Mazure | H01L 27/10861 257/E21.651 |
| 6,037,208 A * | 3/2000 | Wei | H01L 27/1087 257/E21.396 |
| 6,359,300 B1 | 3/2002 | Economikos et al. | |
| 6,693,006 B2 * | 2/2004 | Ho | H01L 21/3086 257/E21.235 |
| 2006/0084222 A1 * | 4/2006 | Rennie | H01L 27/1087 438/243 |
| 2006/0202249 A1 * | 9/2006 | Cheng | H01L 27/1203 257/301 |
| 2013/0069198 A1 * | 3/2013 | Claeys | H01L 29/945 257/532 |

* cited by examiner

*Primary Examiner* — Wael M Fahmy
*Assistant Examiner* — Quinton A Brasfield
(74) *Attorney, Agent, or Firm* — Jacqueline J. Garner; Charles A. Brill; Frank D. Cimino (57) ABSTRACT

A method for forming trench capacitors includes forming a silicon nitride layer over a first region of a semiconductor surface doped a first type and over a second region doped a second type. A patterned photoresist layer is directly formed on the silicon nitride layer. An etch forms a plurality of deep trenches (DTs) within the first region. A liner oxide is formed that lines the DTs. The silicon nitride layer is etched forming an opening through the silicon nitride layer that is at least as large in area as the area of an opening in the semiconductor surface of the DT below the silicon nitride layer. The liner oxide is removed, a dielectric layer(s) on a surface of the DTs is formed, a top plate material layer is deposited to fill the DTs, and the top plate material layer is removed beyond the DT to form a top plate.

20 Claims, 10 Drawing Sheets

INTEGRATED TRENCH CAPACITOR WITH TOP PLATE HAVING REDUCED VOIDS

CROSS-REFERENCE TO COPENDING APPLICATIONS

This application has subject matter related to copending application Ser. No. 15/264,147 entitled "INTEGRATED TRENCH CAPACITOR" that was filed on Sep. 13, 2016.

FIELD

Disclosed embodiments relate generally to the field of integrated circuit (IC) design and processing, more specifically to integrated trench capacitors.

BACKGROUND

There are a number of challenges when attempting to integrate capacitors into the flow for an IC. Conventionally, integrated capacitors are built on the surface of the semiconductor chip, using the Metal-1 or Metal-2 layer for the bottom plate and a TiN layer for the top plate. These capacitors have a capacitive density of approximately 1.5 $\mu F/\mu m^2$ and can attain a highest operating voltage of approximately 8 V. More recently, trench capacitors generally having doped polysilicon top plates have been formed in deep trenches within the substrate or an epitaxial layer on the substrate.

SUMMARY

This Summary is provided to introduce a brief selection of disclosed concepts in a simplified form that are further described below in the Detailed Description including the drawings provided. This Summary is not intended to limit the claimed subject matter's scope.

Disclosed embodiments recognize due to silicon undercutting during the deep trench (DT) silicon etch used to form integrated trench capacitors, the resulting silicon nitride opening at the top of the DT is smaller in area as compared to the area of the silicon opening below it. Due to this silicon undercut, after the top gate material (e.g., polysilicon) deposition for filling the DT and forming the top plate of the trench capacitor there are resulting voids/seams formed at and near the surface of the top plate material within the nitride opening or near the nitride opening. These voids/seams in the top plate material become exposed after the top plate etch, such as using chemical mechanical polishing (CMP), and remain with the integrated trench capacitor in the final integrated circuit (IC).

Problems with voids/seams in the top plate include increased contact resistance. Another problem is the trapping of slurry particles after CMP generally used for defining the top plate, or after a top plate etch such as a plasma etch. Yet another problem in some IC designs is there is a needed electrical contact to the top plate of the trench capacitor that can be rendered an open circuit by the presence of surface voids/seams. For example, for IC designs only allowing one contact in the center of the top plate for the integrated trench capacitors in an array of such capacitors, if the size of void at the surface is larger than the contact size, one will not be able to connect to the top plate resulting in an open circuit. As a result, due to missing the capacitance contribution for one or more integrated trench capacitors in an array of such trench capacitors hooked up in parallel, the capacitance density will be reduced and capacitance variation will be higher due to the randomness of void-induced open circuits.

Disclosed embodiments solve the top plate material layer void problem in DTs for integrated trench capacitors by adding processing including a silicon nitride etch back that renders the area of silicon nitride opening ≥ the area of the silicon opening underneath. Disclosed processing has been found to result in essentially eliminating voids in the top plate of the DT for contact landing. Reduced or eliminated voids in the surface of the top plate is particularly important for integrated high density trench capacitors which have a minimum silicon area to fit a single contact in the center of the top plate needed for the top plate connection to each trench capacitor in the trench capacitor array.

BRIEF DESCRIPTION OF THE DRAWINGS

Reference will now be made to the accompanying drawings, which are not necessarily drawn to scale, wherein.

DETAILED DESCRIPTION

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

Figure 1:
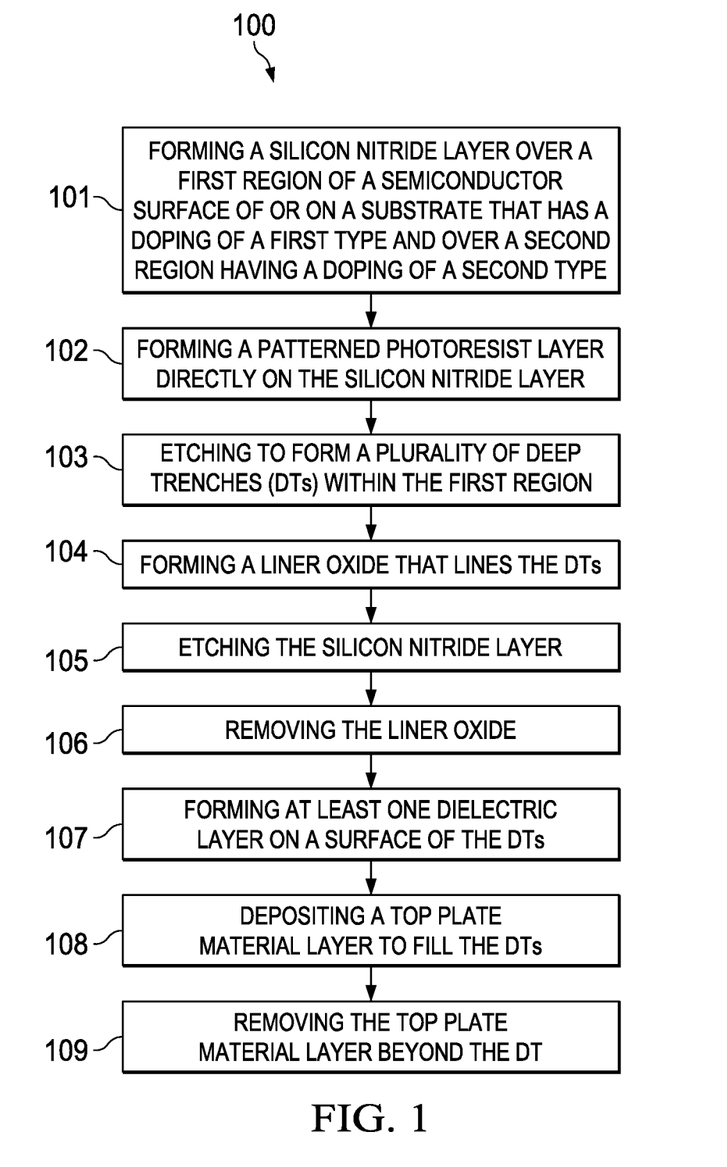
FIG. 1 is a flow chart that shows steps in an example method for forming an integrated trench capacitor on an IC having a top plate with reduced surface voids, according to an example embodiment.

FIG. 1 is a flow chart that shows steps in an example method 100 for forming integrated trench capacitors with reduced top plate surface voids for an IC formed in and on a semiconductor surface, according to an example embodiment. Step 101 comprises forming a silicon nitride layer over a first region of the semiconductor surface that has a doping of a first type and over a second region having a doping of a second (opposite) type. As used herein, "silicon nitride" includes stoichiometric silicon nitride ($Si_3N_4$) or near stoichiometric silicon nitride, as well as silicon oxynitride (SiON) or a silicon-rich silicon nitride layer.

Figure 2A:
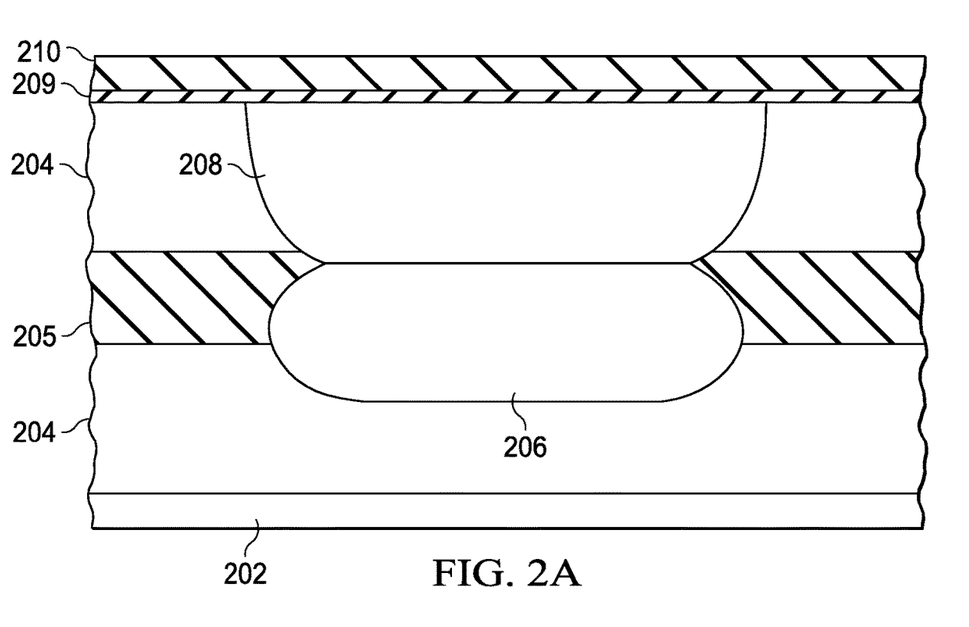
FIG. 2A is a cross sectional depiction showing an in-process integrated trench capacitor after silicon nitride deposition.

FIG. 2A illustrates a portion of an in-process IC on which at least one disclosed integrated trench capacitor will be created after silicon nitride deposition. At this point, a lightly an epitaxial layer (epi layer) 204 such as a P-type epi layer can be been grown on a substrate 202 such as a P+ substrate. A buried layer (BL) 206 can be an N-type BL (NBL) that can be formed during the growth of the epi layer 204. A buried layer 205 of the other dopant type relative to BL 206, such as a P-type BL is also shown provided. The substrate 202 and epi layer 204 can both comprise silicon, and can also comprise other materials.

Additionally, a deep well region 208 is formed, i.e., patterned, deposited and driven in, to be created, such as an N-type deep well (DEEPN) in the case BL 206 is an NBL. In one embodiment, the DEEPN is doped in a range of $1 \times 10^{15}/cm^3$ to $2 \times 10^{16}/cm^3$ and the BL 206 embodies as an NBL is doped in a range $1 \times 10^{15}/cm^3$ to $4 \times 10^{15}/cm^3$. In at least one embodiment, deep well region 208 and BL 206 are used in other regions of the IC to create isolation regions, so that formation of these regions is already part of a flow that does not necessarily include a disclosed integrated capacitor. In effect, Applicants are getting a "free" mask in that regions that are to be used for one plate of the trench capacitor, herein referred to as the bottom plate, can be included in existing masks, so that a new mask is not necessary to create this region. In other embodiments that do not already contain these steps, an additional mask may be used. In at least one embodiment, this point is the beginning of the modular process that can be inserted into an existing flow. On the surface of the epi layer 204 is shown a silicon nitride layer 210 on a silicon oxide layer 209.

Step 102 comprises forming a patterned photoresist layer directly on the silicon nitride layer 210. This is in contrast to a conventional oxide hard mask used on top of the silicon nitride layer 210. The photoresist layer (see photoresist layer 211 in FIG. 2B described below) is created and patterned so that the DTs can be formed. For purposes of illustration, four DTs will be described but more generally one or more likely many more than 4 DTs will be simultaneously formed. A photoresist layer 211 overlies the silicon nitride layer 210, which protects the surface of the IC.

Figure 2B:
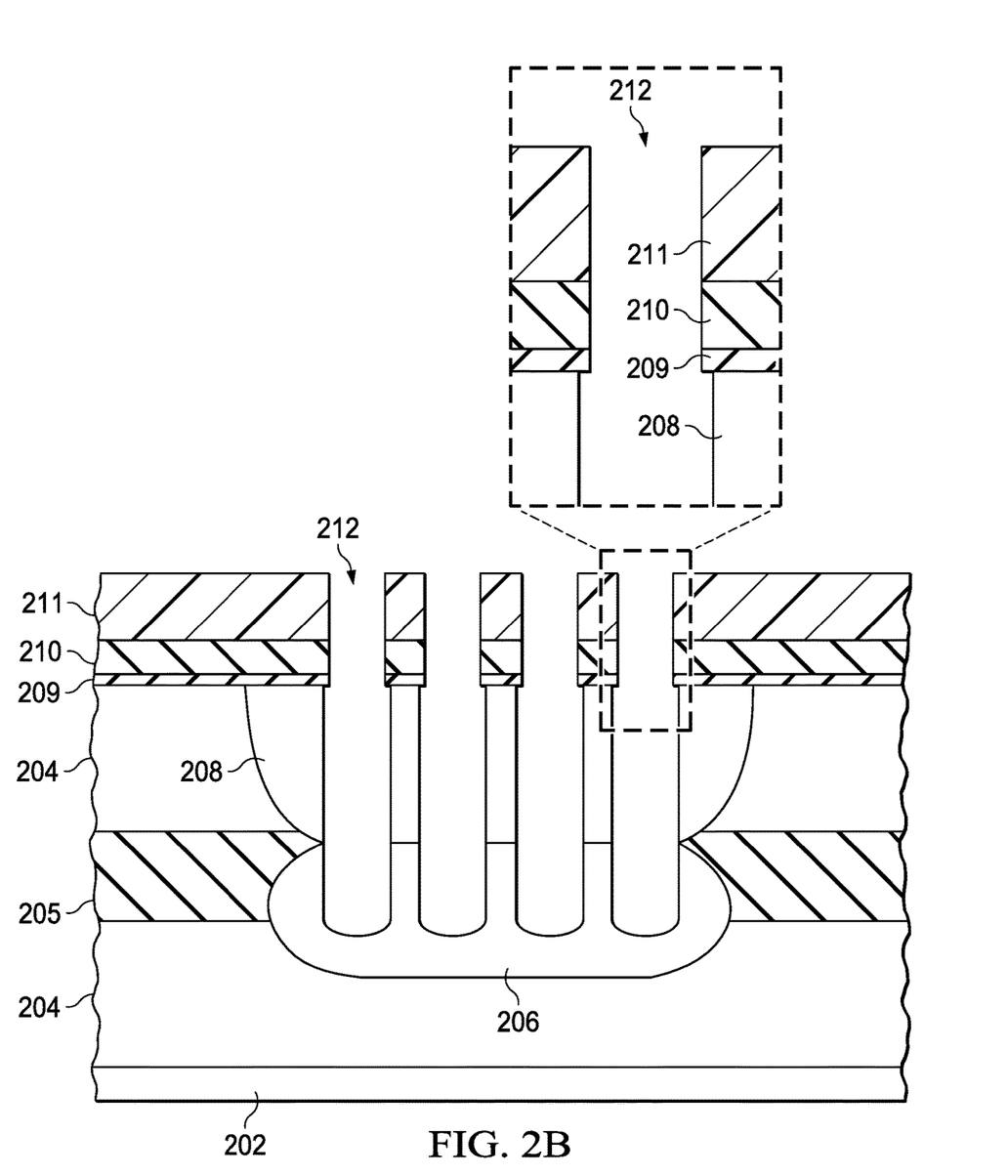
FIG. 2B is a cross sectional depiction showing an in-process integrated trench capacitor after the DTs are formed with the pattered photoresist over the silicon nitride layer lateral to the DTs.

Step 103 comprises etching to form a plurality DTs (see DTs 212 in FIG. 2B described below) within the first region. The DT silicon etch is typically a reactive ion etch (RIE) such as plasma RIE, or a combination of RIE and non-reactive dry or wet etching. FIG. 2B is a cross sectional depiction showing an in-process integrated trench capacitor after the DTs 212 are formed with the pattered photoresist layer 211 over the silicon nitride layer 210 lateral to the DTs using anisotropic etching. As noted above, this etching arrangement is in contrast to a conventional oxide hard mask that is used on top of the silicon nitride layer 210. A silicon undercut is shown in the DTs 212 (see the inset) which are etched through the silicon nitride layer 210, silicon oxide layer 209 and into the deep well 208/BL 206. It will be understood that although photoresist layer 211 is shown as remaining intact after etching, much of the photoresist layer 211 may by removed by the DT etch process.

In at least one embodiment, such as using a circular trench layout, the width of the trenches is approximately 0.9 μm to 1.2 μm and the trenches are spaced apart approximately 0.5 μm to 1.0 μm. For an isolated trench capacitor, the depth of the trenches is determined by the depth of the isolation tank. The trench depth for the DTs can, of course, be deeper or shallower as required by a given application and to fit within the parameters of the process into which the trench capacitor is being integrated, e.g., the thickness of the epitaxial layer and the drive conditions for the deep well. In one embodiment for an isolated trench capacitor, RIE is used at least in part and the trench depth can be in the range of 5 μm to 9 μm. For a non-isolated capacitor the depth can be 20 μm deeper. In other embodiments, the depth of the trench can remain the same, while the thickness of capacitor's dielectric layer between its respective plates is varied to change the voltage rating of the trench capacitor.

Due to conventional undercut during the DT Si etch, the silicon nitride opening at top of the trench is recognized to be smaller in area compared to the Si opening below it. Once the top plate material completely fills at the nitride opening (see FIG. 2F described below), some voids/seams are formed in the surface of the top plate material. These voids/seams become exposed when the silicon nitride layer is removed from the wafer surface. (see FIG. 2H described below). The photoresist layer 211 is then removed and the wafer cleaned.

Figure 2C:
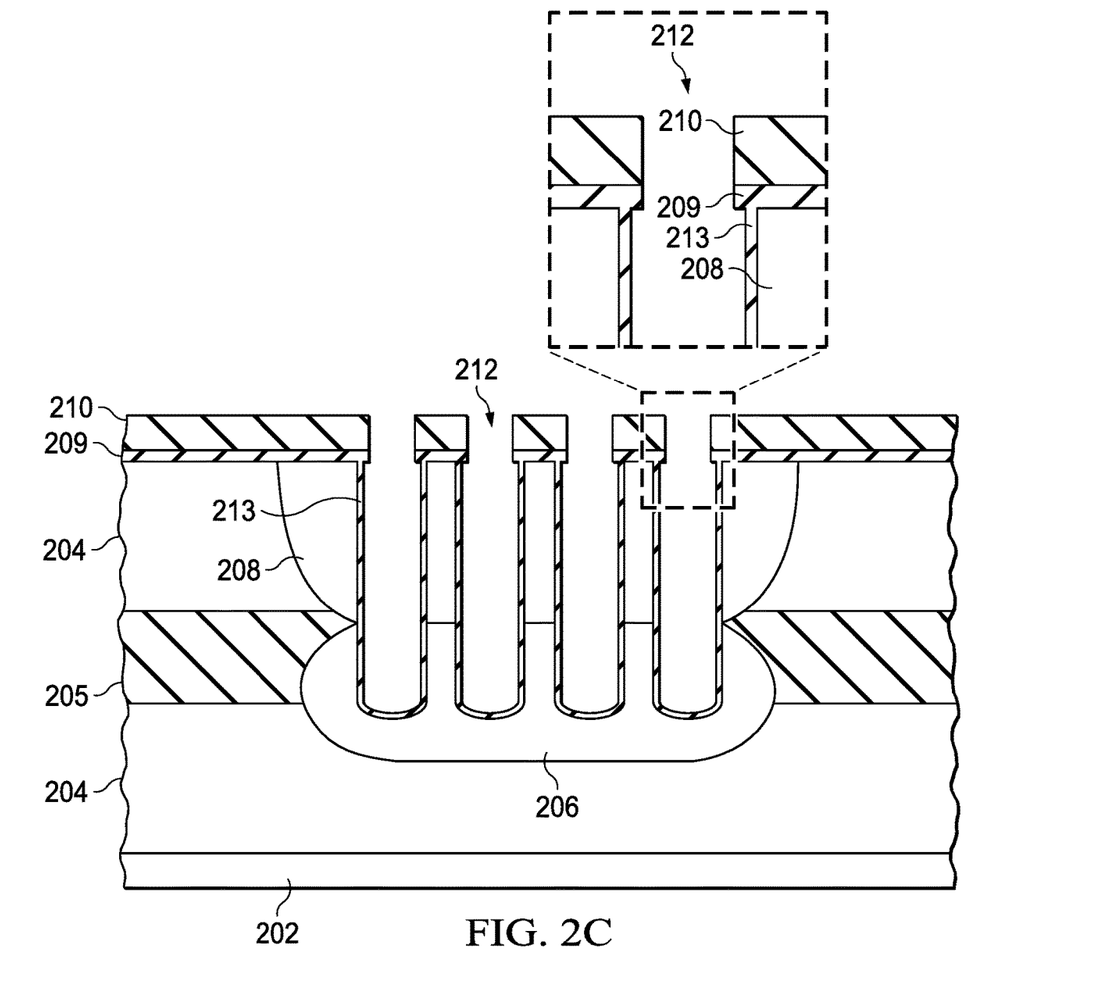
FIG. 2C is a cross sectional depiction showing an in-process integrated trench capacitor after forming the liner oxide inside the DTs.

Step 104 comprises forming a liner oxide 213 that lines the DTs. FIG. 2C is a cross sectional depiction showing an in-process integrated trench capacitor after forming the liner oxide inside the DTs. The liner oxide 213 in some embodiments can be 100 Å to 200 Å thick formed on the sidewalls of DTs 212 using a dry oxidation process or a deposition process.

Figure 2D:
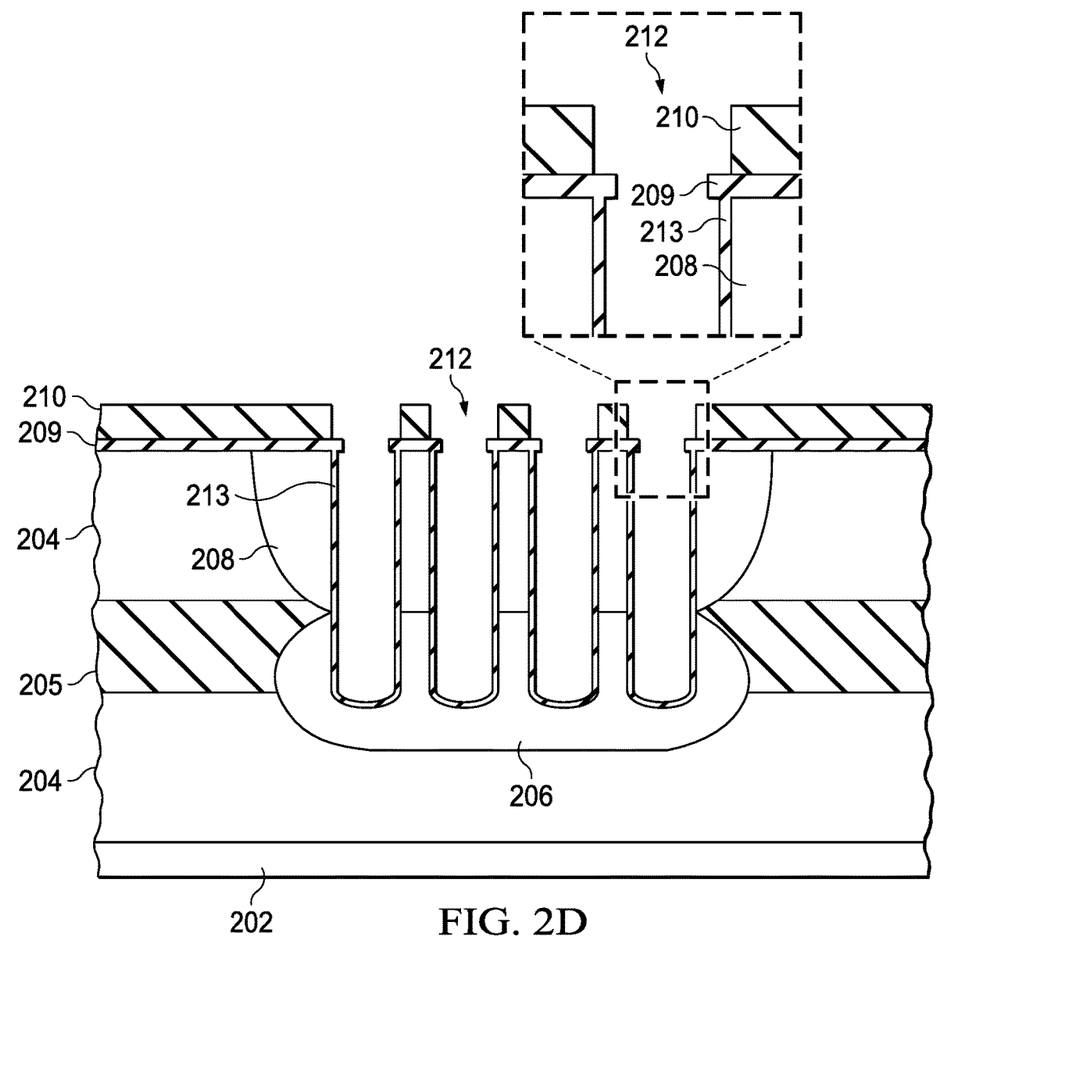
FIG. 2D is a cross sectional depiction showing an in-process integrated trench capacitor after wet nitride pull back etch.

Step 105 comprises wet etching the silicon nitride layer 210. Heated phosphoric acid ($H_3PO_4$) can be used for silicon nitride etch selectivity relative to surrounding materials. A buffered oxide etch (BOE) dip can be first used to remove a thin oxynitride layer that may be on the silicon nitride layer 210. After the wet etching an opening through the silicon nitride layer 210 is at least as large in area as the area of an opening in the DT 212 below the silicon nitride layer to make the size of the silicon nitride opening ≥ the size of the silicon opening below.

FIG. 2D is a cross sectional depiction showing an in-process integrated trench capacitor after wet nitride pull back etch. As shown in the inset, after the nitride pull-back etch the area of the silicon nitride 210 opening is larger in area as compared to the area of the silicon opening below in the DTs 212.

Figure 2E:
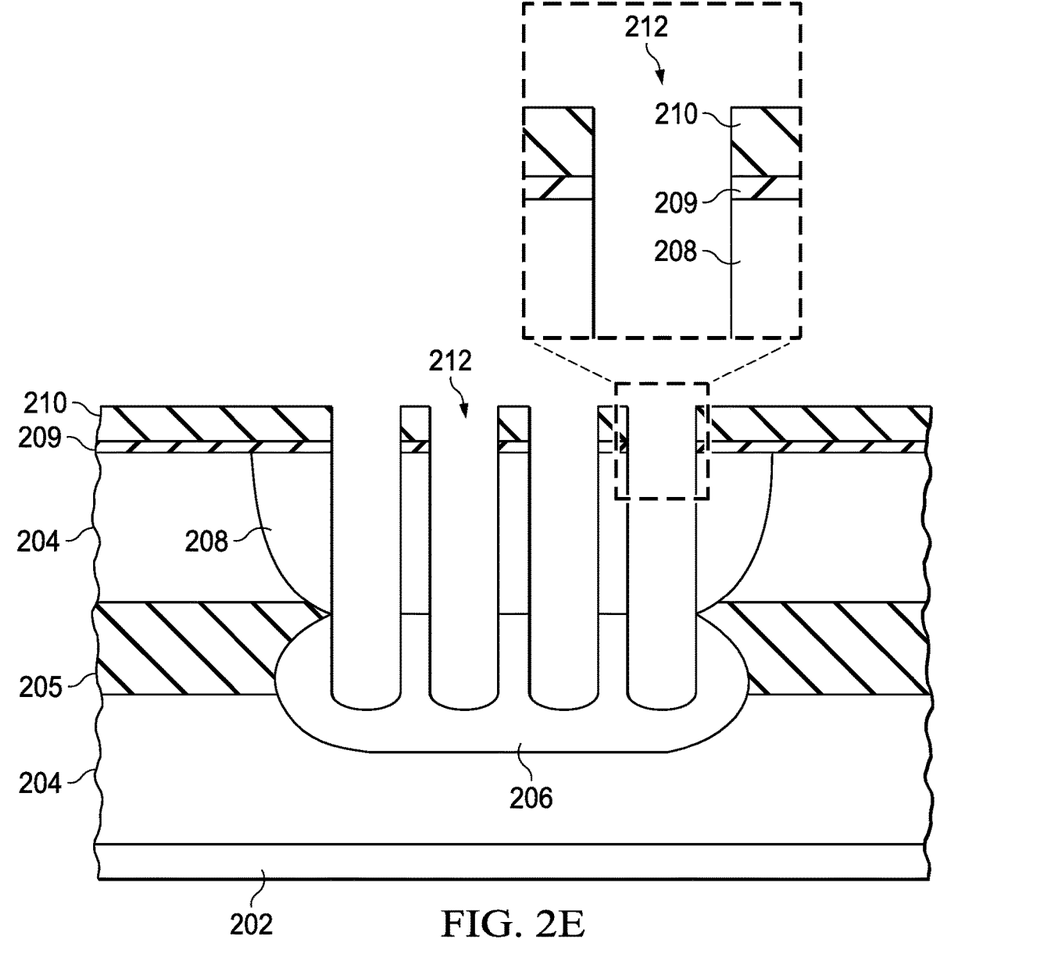
FIG. 2E is a cross sectional depiction showing an in-process integrated trench capacitor after the removing the liner oxide.
Figure 2F:
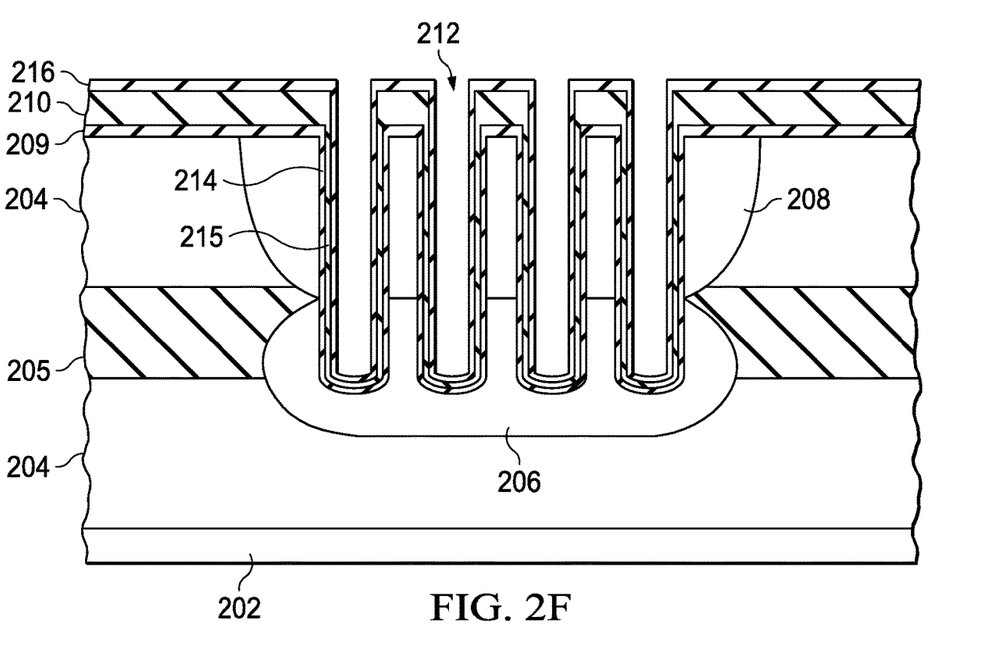
FIG. 2F is a cross sectional depiction showing an in-process integrated trench capacitor after forming dielectric layers on a surface of the DTs.

Step 106 comprises removing the liner oxide layer 213. The liner oxide 213 is removed because it is generally phosphorous (or other dopant) contaminated. FIG. 2E is a cross sectional depiction showing an in-process integrated trench capacitor after the removing the liner oxide layer 213. The liner oxide layer 213 strip process can comprise an etch designed to remove the nominal liner oxide thickness with about a 200% over etch. Step 107 comprises forming at least one dielectric layer on a surface of the DTs. FIG. 2F is a cross sectional depiction showing an in-process integrated trench capacitor after forming dielectric layers which can comprise in one embodiment a silicon oxynitride layer 216 on a silicon nitride layer 215 on a silicon oxide layer 214 on sidewall surfaces of the DTs 212.

Figure 2G:
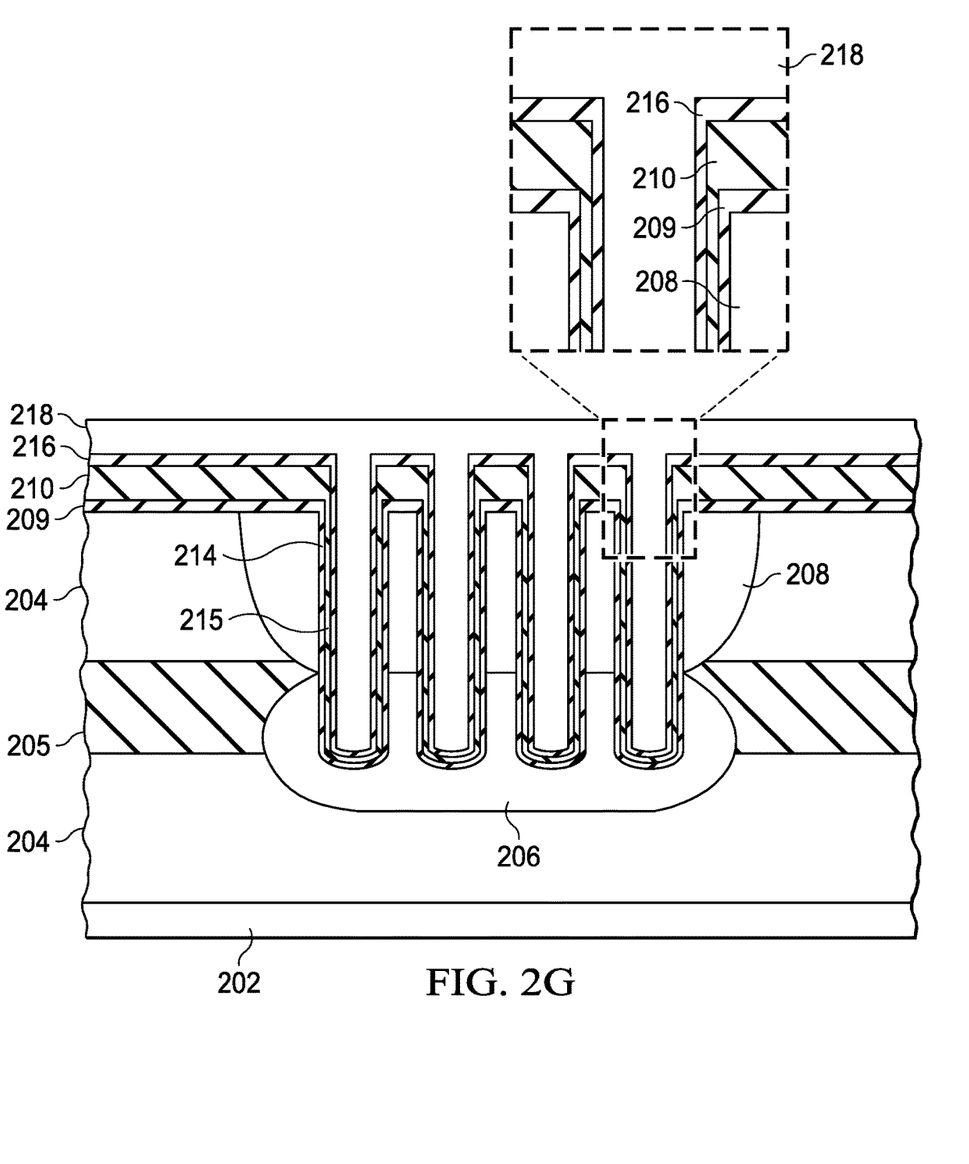
FIG. 2G is a cross sectional depiction showing an in-process integrated trench capacitor after depositing the top plate material layer to fill the DTs.
Figure 2H:
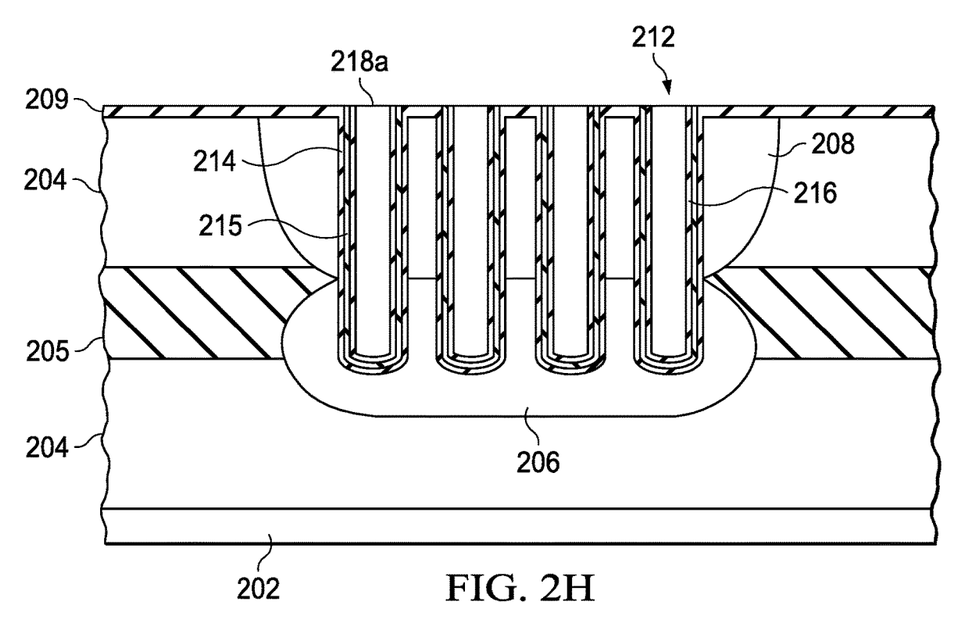
FIG. 2H is a cross sectional depiction showing an in-process integrated trench capacitor after removing the top plate material layer beyond the DT and after removing the silicon nitride layer.

Step 108 comprises depositing a top plate material layer to fill the DTs. FIG. 2G is a cross sectional depiction showing an in-process integrated trench capacitor after depositing the top plate material layer 218 to fill the DTs. The top plate material can generally be any electrically conductive layer, such as doped polysilicon either provided in-situ doped or extrinsically doped by ion implantation. Alternatively, the top plate material can comprise an electrically conductive transition metal compound such as electrically conductive transition metal nitrides including TiN and TaN (e.g., by magnetron sputtering). WSi, WN and WSi are also possible top plate materials. The top plate material layer 218 may also comprise two or more different layers. Step 109 comprises removing the top plate material layer 218 beyond the DT to form the top plate 218a. FIG. 2H is a cross sectional depiction showing an in-process integrated trench capacitor after removing the top plate material layer 218 beyond the DT (e.g., using CMP) and then removing the silicon nitride layer 210.

Although not shown, the method can include another mask level to form dielectric isolation (LOCOS or STI) around the perimeter of each DT. For example, in the case of STI, photoresist can be formed on the wafer surface and patterned to expose areas where the STI trenches are to be etched. STI trenches are then etched into the wafer surface, after which the photoresist layer used to define the STI trenches can be removed. A typical STI trench depth is approximately 250 nm to 375 nm. A liner oxide (not specifically shown) can be grown or deposited on the exposed surfaces of the STI trench and the trench is overfilled with a high density plasma (HDP) oxide using chemical vapor deposition (CVD). Finally, the HDP oxide can be planarized using CMP to form the STI (see STI 318 in FIG. 3 described below).

At a later point in the processing, source/drain regions are formed on the IC. The trench capacitor can receive these implants to finalize the doping for the trench capacitor. Another photoresist layer can be formed on the wafer and patterned with an N-type source/drain pattern and the wafer implanted with an N-type dopant such as phosphorus to form N+ regions. After this pattern is removed, another photoresist layer is deposited on the wafer and patterned with a P-type source/drain pattern and the wafer is implanted with a P-type dopant such as boron to form a P+ Regions. Once this photoresist layer is removed, the source/drain implants are annealed. Contact regions for both the bottom plate and the top plate are also formed. These steps complete formation of the trench capacitor. It will be understood that other processing can continue on the IC to form other components desired on the chip.

Figure 3:
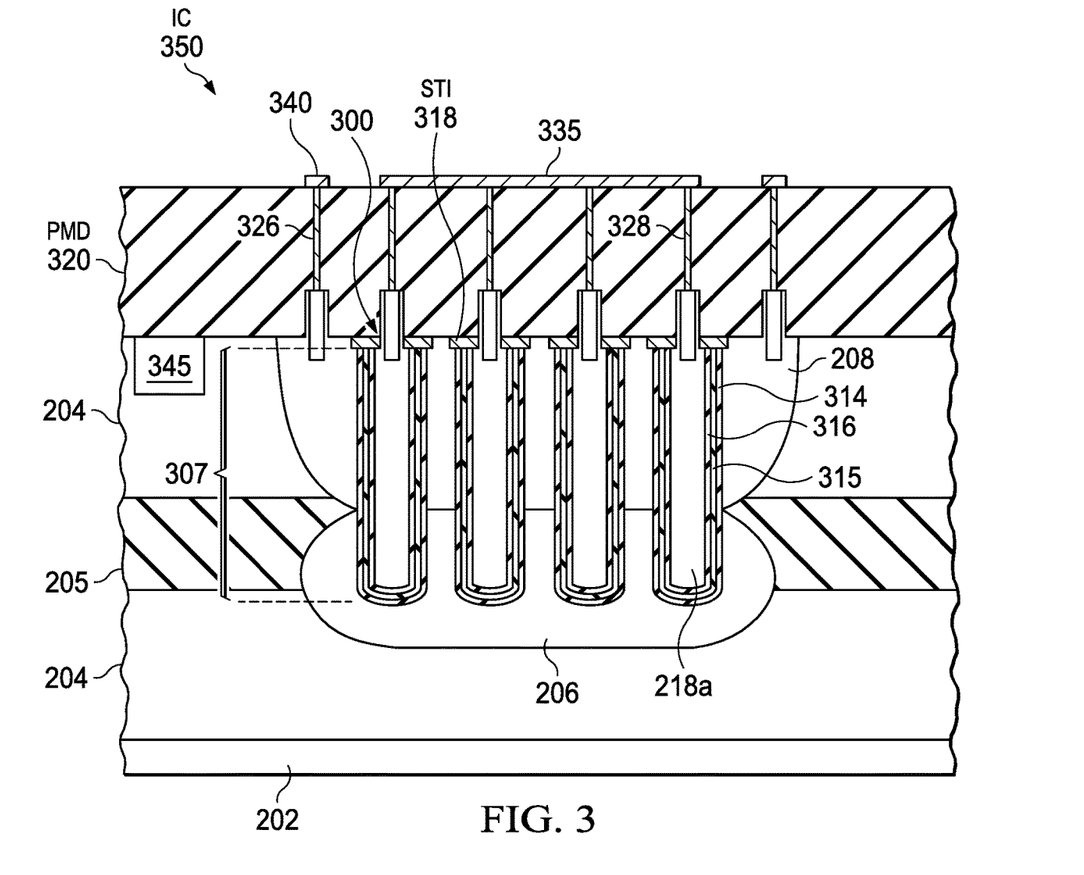
FIG. 3 is a cross sectional depiction showing an IC including an example essentially complete integrated trench capacitor with reduced top plate surface voids that can be integrated into existing process flows, according to an example embodiment.

FIG. 3 is a cross sectional depiction showing an IC 350 including essentially complete integrated trench capacitors 300 with reduced top plate surface voids that can be integrated into existing process flows, according to an example embodiment. Block 345 represents functional circuitry, which is integrated circuitry generally including a plurality of transistors, as well as resistors and capacitors all configured together to provide a circuit function that realizes and carries out a desired functionality of the IC 350. For example, that of a digital IC (e.g., digital signal processor) or analog IC (e.g., amplifier or power converter), such as a BiMOS IC. The capability of functional circuitry provided by IC 350 may vary, for example ranging from a simple device to a complex device. The specific functionality provided by block 345 is not of importance to disclosed embodiments.

The trench capacitors 300 are shown created in an epi layer 204 that is grown on a substrate 202, which in at least one embodiment is doped with a P-type dopant (e.g., boron). As noted above, the substrate 202 and epi layer 204 can both comprise silicon, and can also comprise other materials.

The bottom plate 307 of the trench capacitors 300 includes the BL 206, and deep well 208 and generally also a source/drain in the deep well 208, which in at least one embodiment receives N+ doping (e.g., phosphorus). In at least one embodiment, an implant of N+ doping and thermal drive is used to form heavily-doped deep well 208. By doping the deep well 208 with an opposite type doping from that of the substrate 202, the trench capacitors 300 are junction isolated from the substrate 202 by this pn junction. Given this junction isolation, the trench capacitors 300 may have a high voltage on either electrode/plate. In at least one embodiment the substrate 202 and the deep well 208 have the same type of doping, such that the trench capacitors 300 are not junction isolated from the substrate 202. In this embodiment, the bottom plate of the trench capacitors 300 will be grounded and only the top plate will be able to be coupled to high voltage.

DTs are formed on the bottom plate 307 and are then lined with at least one dielectric layer shown as 314 (e.g., silicon oxide), 315 (e.g., silicon nitride) and 316 (e.g., silicon oxynitride). A top plate layer 218, such as comprising polysilicon can be deposited over the dielectric layer(s) using in situ doping to fill and overfill the DT's and then be planarized, e.g., by CMP. In at least one embodiment, the top plate layer 218 comprises polysilicon that receives P+ doping, such as boron from in-situ doping at level of $1\times10^{18}$ to $5\times10^{19}$ cm$^{-3}$.

The point at which the dielectric layers 314-316 intersect the upper surface of epi layer 204/bottom plate 307 is recognized to be fragile and subject to damage during later processing. In order to protect these fragile areas to limit leakage, STI or LOCOS regions can be formed at the surface of the IC overlying the sidewalls of the previously-filled DTs. The capacitor 300 is shown including STI regions 318 formed at the surface of the IC overlying the sidewalls of the previously-filled DTs.

When transistors on the IC 350 receive source/drain (S/D) implants, both the bottom plate 307 and top plate 218a can also receive appropriate types of S/D implants. Filled vias 326 (e.g., filled with W) through a pre-metal dielectric (PMD) 320 contact the bottom plate 307 and filled vias 328 (e.g., filled with W) through the PMD 320 contact the top plate 218a as part of the metallization layers. A metal 1 connection over the PMD 320 to the top plate 218a by the filled vias 328 is shown as 335 and a metal 1 connection over the PMD 320 to the bottom plate 307 by the filled vias 326 is shown as 340.

In at least one embodiment, the formation of the trench capacitors 300 is modular and can be inserted into existing processes without disrupting other portion of the process flow for the IC 350. In at least one embodiment, the formation of the bottom plate 307 occurs during the creation of isolation regions in other portions of the IC. In at least one embodiment, STI or LOCOS regions are formed in conjunction with the formation of STIs or LOCOS regions on other regions of the IC. In at least one embodiment, the modular flow that is exclusively for the trench capacitor includes a single mask to pattern for the deep trench etch, formation of the deep trenches, formation of a dielectric on the surface of the deep trenches, and filling the deep trenches with a top plate material (e.g., doped polysilicon) to form the top plate 218a.

Applicants have disclosed a trench capacitor that can be integrated into existing semiconductor processor flows. Disclosed embodiments can be implemented in technologies that use a BL and deep well combination for isolation. The trench capacitor density may be as much as ten times higher than a known TiN capacitor, e.g., 15 μF/μm$^2$ and adds only a single mask to the process. At least some disclosed embodiments can support 12 V and even 20 V applications.

Regarding inventive distinctions, conventional solutions to mitigate voiding in the surface of the top plate materials such as polysilicon use an etch back after top plate metal fill and then redeposit top metal to try to eliminate the voids/seams. This requires these solutions in the case of polysilicon to include a second polysilicon deposition process, and a resulting polysilicon interface can be seen such as by a scanning electron microscope (SEM) inspection that is not present for disclosed top plate 218a in disclosed trench capacitors because of a single top plate deposition process enabled by disclosed processing including a nitride pull back etch step. Another distinction is the low percentage of voids at a surface of the top plate 218a, which is voids with a size larger than 0.1 μm being less than or equal to (≤1%), such as (≤0.1%). This enables reliable contact to be made to the top plate of disclosed trench capacitors when the area allotted in the IC design is sufficient to only provide a single contact for connection to the top plate. Other advantages for disclosed embodiments include relative simplicity and low implementation cost.

Disclosed embodiments can be used to form semiconductor die that may be discrete devices or part of integrated circuits integrated into a variety of assembly flows to form a variety of different devices and related products. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, Insulated Gate Bipolar Transistor (IGBT), CMOS, BiCMOS and MEMS.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

The invention claimed is:

1. A method for forming trench capacitors in a semiconductor surface of an integrated circuit (IC), comprising:
    forming a silicon nitride layer over a first region of said semiconductor surface that has a doping of a first type and over a second region having a doping of a second type;
    forming a patterned photoresist layer directly on said silicon nitride layer;
    etching within said first region to form a plurality of deep trenches (DTs);
    forming a liner oxide that lines said DTs;
    after forming the plurality of deep trenches and forming the liner oxide, wet etching said silicon nitride layer, wherein after said wet etching, an opening through said silicon nitride layer is at least as large in area as an area of an opening in said semiconductor surface of said DT below said silicon nitride layer;
    removing said liner oxide;
    forming at least one dielectric layer on a surface of said DTs;
    depositing a top plate material layer on said dielectric layer to fill said DTs, and
    removing said top plate material layer beyond said DTs to form a top plate.

2. The method of claim 1, wherein said top plate material layer comprises polysilicon.

3. The method of claim 2, wherein said depositing comprises in-situ doped (ISD) depositing.

4. The method of claim 1, wherein said removing said top plate material layer comprises chemical mechanical polishing (CMP).

5. The method of claim 1, wherein said top plate material layer comprises polysilicon, and wherein said top plate is exclusive of any polysilicon interface.

6. The method of claim 5, wherein a percentage of voids at a surface of said top plate with a size larger than 0.1 μm is less than or equal to 1%.

7. The method of claim 1, wherein a depth of said DTs is between 5 μm and 20 μm.

8. The method of claim 1, further comprising forming shallow trench isolation (STI) or local oxidation of silicon (LOCOS) regions at an upper surface of said semiconductor surface where said dielectric layer intersects said upper surface.

9. The method of claim 1, wherein said trench capacitors have an area on said IC only sufficient to provide a single contact for connection to said top plate.

10. The method of claim 1, wherein said dielectric layer comprises silicon nitride.

11. A method for forming an integrated circuit (IC), comprising:
    forming a silicon nitride layer over a first region of a semiconductor substrate that has a first conductivity type and over a second region having a second conductivity type;
    forming a photoresist pattern directly on the silicon nitride layer;
    using the photoresist pattern, etching openings in the silicon nitride layer and etching the semiconductor substrate within the first region to form a plurality of deep trenches (DTs) at the openings;
    forming a liner oxide that lines the DTs;
    after forming the DTs and forming the liner oxide, wet etching the silicon nitride layer, wherein after the wet etching, the openings through the silicon nitride layer are widened to at least as wide as the DTs;
    removing the liner oxide;
    forming at least one dielectric layer on a surface of the DTs;
    depositing a top plate material layer on the dielectric layer to fill the DTs; and
    removing the top plate material layer beyond the DTs to form a top plate of trench capacitors.

12. The method of claim 11, wherein the top plate material layer comprises polysilicon.

13. The method of claim 12, wherein said depositing comprises in-situ doped (ISD) depositing.

14. The method of claim 11, wherein said removing the top plate material layer comprises chemical mechanical polishing (CMP).

15. The method of claim 11, wherein the top plate material layer comprises polysilicon, and wherein the top plate is exclusive of any polysilicon interface.

16. The method of claim 14, wherein a percentage of voids at a surface of the top plate with a size larger than 0.1 μm is less than or equal to 1%.

17. The method of claim 11, wherein a depth of the DTs is between 5 μm and 20 μm.

18. The method of claim 11, further comprising forming isolation regions at an upper surface of the semiconductor substrate, wherein the dielectric layer intersects the upper surface.

19. The method of claim 11, wherein the trench capacitors have an area on the IC only sufficient to provide a single contact for connection to the top plate.

20. The method of claim 11, wherein said dielectric layer comprises a layer of silicon oxide, a layer of silicon nitride and a layer of silicon oxynitride.

\* \* \* \* \*